United States Patent [19]

Watanabe

[11] 4,213,125
[45] Jul. 15, 1980

[54] DISPLAY SYSTEM HAVING VOLTAGE COMPARATOR CIRCUIT

[75] Inventor: Shizuhisa Watanabe, Katsuta, Japan

[73] Assignee: Hitachi, Ltd., Tokyo, Japan

[21] Appl. No.: 891,035

[22] Filed: Mar. 28, 1978

[30] Foreign Application Priority Data

Mar. 30, 1977 [JP] Japan ................................. 52/34623

[51] Int. Cl.² .............................................. G06F 3/14
[52] U.S. Cl. ...................................... 340/753; 324/96; 324/122; 340/57; 340/782
[58] Field of Search ............... 340/324 R, 324 M, 336, 340/166 EL, 324 A, 753, 754, 57, 762, 782; 324/96, 122

[56] References Cited

U.S. PATENT DOCUMENTS

| | | | |
|---|---|---|---|
| 3,629,838 | 12/1971 | Taylor | 340/324 A |
| 3,739,369 | 6/1973 | Bunker et al. | 340/324 A |
| 3,771,015 | 11/1973 | Miller | 340/324 R |
| 4,009,414 | 2/1977 | Bockett-Pugh | 340/166 EL |
| 4,028,616 | 6/1977 | Stevens | 324/122 |
| 4,097,857 | 6/1978 | Miyakawa | 340/166 EL |

*Primary Examiner*—Marshall M. Curtis
*Attorney, Agent, or Firm*—Craig & Antonelli

[57] ABSTRACT

In a display system having one comparator for comparing an input voltage signal with a reference voltage signal, the reference voltage signal is successively changed in accordance with a timing signal from a timing signal generator and the outputs corresponding to the respective reference voltages are applied to the associated display elements in synchronism with the timing signal so that the display elements are successively lit up.

2 Claims, 27 Drawing Figures

DISPLAY SYSTEM HAVING VOLTAGE COMPARATOR CIRCUIT

This invention relates to a display system having a voltage comparator circuit, and more particularly to such a display system wherein a plurality of display elements are adapted to be lit up successivelly in accordance with the varying value of the input signal.

There have hitherto been proposed voltage comparator circuits wherein output terminals are provided in association with several points preset for an input signal whose value varies in a constant voltage range and output signals are sequentially delivered from the output terminals when the value of the input signal exceeds the preset points (see U.S. Pat. Nos. 3,739,222 and 4,006,412). Such voltage comparator circuits are used, for example, to indicate an analog quantity such as the temperature of water or the remaining amount of fuel left behind in a histogram or bar-graph representation, by connecting a plurality of display elements such as light emitting diodes, fluorescent discharge tubes, electroluminescent cells or liquid crystal cells at the output side of the voltage comparator circuit and by causing them to emit light successively (see U.S. Ser. No. 768,346 filed on Feb. 14, 1977 and assigned to the same assignee as this application).

Now, a brief description of such a display apparatus will be given in conjunction with the indication of water temperature. A thermistor is used as a sensor for water temperature so that the variation in the resistance of the thermistor according to the temperature of water is transduced into a voltage which is in turn used as an input signal. There are provided comparators in the same number as there are display elements and the input signal is compared with reference signals by the comparators. When the input signal exceeds in magnitude the reference signal associated with a certain comparator, the display element corresponding to the comparator is lit up. Since in this method comparators in the same number as that of the display elements must be used, the increase in the number of the display elements is accompanied by an increase in the number of comparators with the result that the production cost becomes high. Further, when it is desired to fabricate the circuit in IC configuration, it is difficult to increase the integration density since the comparators are analog circuits.

An object of this invention is to provide a display system which uses only one comparator to obtain successive outputs corresponding to a plurality of points reset for an input signal.

According to one aspect of this invention, there is provided a display system wherein a plurality of display elements are driven by a voltage comparator circuit which produces a digital signal corresponding to the change in an input signal, said voltage comparator circuit comprising: a comparator having one input terminal applied with a first reference voltage, the other input terminal applied with a second reference voltage, and an output terminal, said input signal being superimposed to at least one of said input terminals; control means for changing one of said first and second reference voltages, in accordance with a timing signal, to a plurality of preset voltages of predetermined levels corresponding to the number of said display elements to produce output signals relates to said preset voltages; a plurality of gate means connected between the output terminal of said comparator and said display elements respectively; and means for selectively enabling said gate means in synchronism with said timing signal to energize the display means associated with the enabled gate means and corresponding to the preset voltage being applied to said comparator.

According to another aspect of this invention, there is provided a display system wherein a plurality of display elements are driven by a voltage comparator circuit which produces output signals corresponding to a plurality of voltages preset for an input signal when the voltage level of said input signal reaches the preset voltages respectively, said voltage comparator circuit comprising: a comparator having one input terminal applied with said input signal, the other input terminal applied with said preset voltages, and an output terminal; control means for successively applying said preset voltages to the other input terminal of said comparator in accordance with a timing signal, so that said comparator successively produces said output signals corresponding to said preset voltages in synchronism with said timing signal; a plurality of gate means connected between the output terminal of said comparator and said display elements respectively; and enabling means for selectively enabling said gate means in synchronism with said timing siganl to energize the display element associated with the enabled gate means and corresponding to the present voltage being applied to said comparator.

According to a further aspect of this invention, there is provided a display system wherein a plurality of display elements are driven by a voltage comparator circuit which produces output signals corresponding to a plurality of voltages preset for two input signals when the voltage level of said input signals reaches the present voltages respectively, said voltage comparator circuit comprising: switch means for alternatively supplying said two input signals for predetermined time intervals in its alternate change-over action; a comparator having one input terminal applied with said input signals alternately supplied from said switch means, the other output terminal applied with said preset voltages, and an output terminal; counter means for generating a timing signal; control means for effecting the alternate change-over action of said switch means in accordance with said timing signal from said counter means and for successively applying said preset voltages to the other input terminal of said comparator in accordance with said timing signal from said counter means, so that said comparator successively produces said output signals corresponding to said preset voltages in synchronism with said timing signal; a plurality of gate means connected between the output terminal of said comparator and said display elements respectively; and means for selectively enabling said gate means in synchronism with said timing signal to energize the display element associated with the enabled gate means and corresponding to the preset voltage being applied to said comparator.

Figure 1:
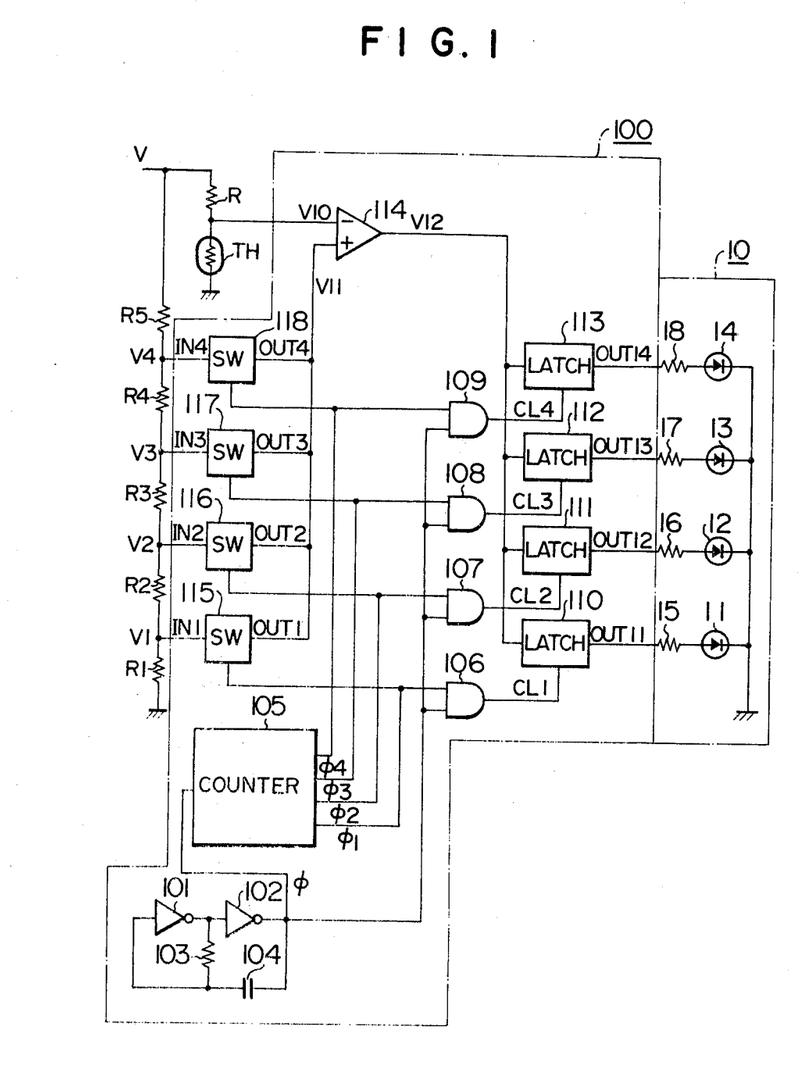
FIG. 1 shows a circuit diagram of a display system as a first embodiment of this invention.
Figure 2A:
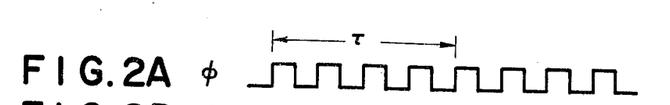
FIGS. 2A, 2B, 2C, 2D, 2E, 2F, 2G, 2H and 2I show waveforms appearing at various points in the system shown in FIG. 1.
Figures 2B, 2C:
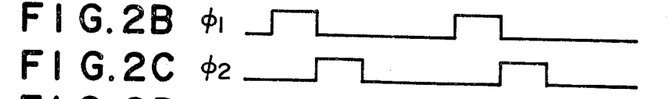
Figures 2D, 2E:
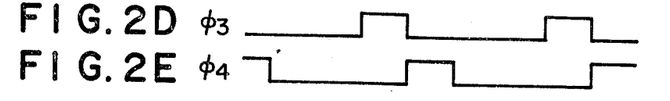
Figure 2F:
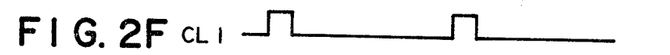
Figure 2G:
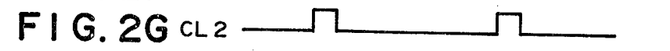
Figure 2H:
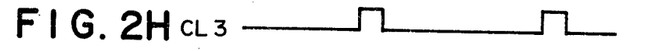
Figure 2I:
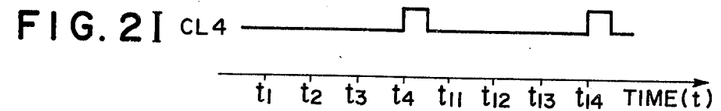

The above and other objects and features of this invention will be better understood when reading the preferred embodiments in conjunction with the accompanying drawings, in which:

FIG. 1 illustrates a circuit diagram of a display system as a first embodiment of this invention in which this invention is applied to the indication of the water temperature in a vehicle.

Referring to FIG. 1, a voltage comparator circuit 100 comprises inverters 101 and 102, a resistor 103, a capacitor 104, a counter 105, AND circuits 106 to 109, latch circuits 110 to 113, a comparator 114, and lateral switches 115 to 118. A display section 10 comprises light emitting diodes 11 to 14 and resistors 15 to 18. A thermistor TH is used as a sensor for detecting the water temperature and is connected in series with a resistor R with respect to a power source voltage V. A voltage developed across the thermistor TH in accordance with the variation in the resistance thereof is used as an input signal $V_{10}$ to one input terminal of the comparator 114. There may be several ways of determining preselected points for the input signal. In the embodiment shown in FIG. 1, a voltage division scheme using resistors is employed in which the power source voltage V is applied to a series circuit of resistors $R_1$ to $R_5$.

FIGS. 2A to 2I show waveforms appearing at various points in the system in FIG. 1 when the circuit operates.

The inverters 101, 102, the resistor 103 and the capacitor 104 constitute an oscillation circuit to generate a rectangular waveform signal $\phi$ (see FIG. 2A) whose oscillation period can be controlled depending on the time constant determined by the resistor 103 and the capacitor 104. The oscillation signal $\phi$ is supplied to the counter 105 which in turn delivers signals $\phi_1$, $\phi_2$, $\phi_3$ and $\phi_4$ (see FIGS. 2B, 2C, 2D and 2E) sequentially providing level "1". The signals $\phi_1$, $\phi_2$, $\phi_3$ and $\phi_4$ are supplied respectively to first input terminals of the AND circuits 106, 107, 108, and 109. Second input terminals of the AND circuits 106 to 109 are connected in common with the output end of the inverter 102 which serves as the output terminal of the oscillation circuit. The AND combinations of the oscillation signal $\phi$ and the signals $\phi_1$ to $\phi_4$ are made in the AND circuits 106 to 109 which respectively produce the output signals having waveforms as shown in FIGS. 2F to 2I. As seen from FIGS. 2F to 2I, the duration of the level "1" of the output signals of the AND circuits 106 to 109 is half the duration of the level "1" of the signals $\phi_1$ to $\phi_4$. The output signals of the AND circuits 106 to 109 are hereafter referred to as clock signals $CL_1$ to $CL_4$ respectively. The latch circuits 110 to 113 respectively deliver output signals $OUT_{11}$ to $OUT_{14}$ which have the same logic level as an input signal $V_{12}$ (i.e. the output of the comparator 114) has when the clock signals $CL_1$ to $CL_4$ take the level "1". Each latch circuit has the function of holding the output signal until the clock signals take the next level "1".

When the signals $\phi_1$ to $\phi_4$ from the counter 105 are at the level "1", the lateral switches 115 to 118 become respectively conductive to deliver the divided voltages $IN_1$ to $IN_4$, provided by the resistors $R_1$ to $R_5$, to the outputs $OUT_1$ to $OUT_4$. When the signals $\phi_1$ to $\phi_4$ are at the level "0", the lateral switches 115 are cut off.

Figure 3:
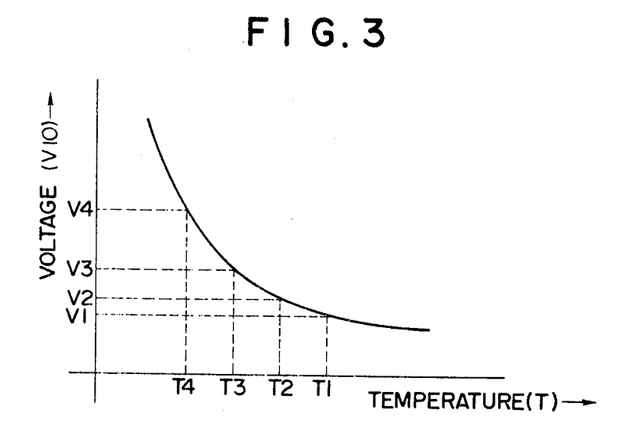
FIG. 3 graphically shows the variation in the resistance of the thermistor used in the circuit shown in FIG. 1.
Figure 4:
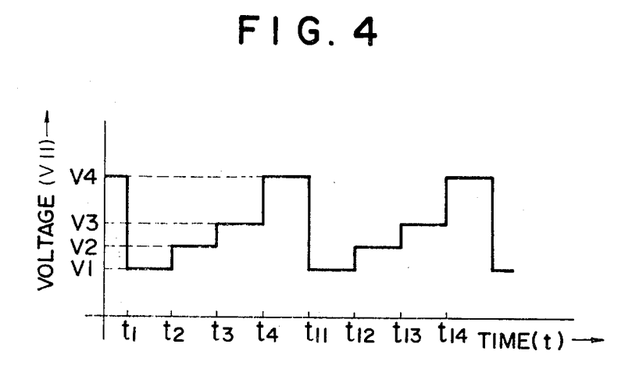
FIG. 4 is a timing chart showing an example of a comparator reference voltage signal employed in this invention.

FIG. 3 shows how the resistance value of the thermistor TH or the voltage developed across the thermistor TH changes with the temperature thereof. As seen from FIG. 3, the resistance value changes logarithmically with temperature. Since it is preferable to graduate the temperature scale uniformly, temperatures $T_1$, $T_2$, $T_3$ and $T_4$ are selected with a predetermined interval as shown in FIG. 3, the voltages $V_1$, $V_2$, $V_3$ and $V_4$ being set corresponding to the temperatures $T_1$, $T_2$, $T_3$ and $T_4$. The respective set points or voltages $V_1$ to $V_4$ are used as threshold levels for the energizations of the light emitting diodes 11 to 14. Above the temperature $T_1$, all the light emitting diodes 11 to 14 are lit up. Between the temperatures $T_1$ and $T_2$, the three diodes 12, 13 and 14 are lit up. Between the temperatures $T_2$ and $T_3$, the two diodes 13 and 14 are lit up. Between the temperatures $T_3$ and $T_4$, only the diode 14 is lit up. Below the temperature $T_4$, none of the diodes 11 to 14 are energized to emit light. To that end, it is necessary to make the reference voltages for the comparator 114 equal to $V_1$ to $V_4$ by properly selecting the values of the resistor $R_1$ to $R_5$. The thus preset voltages $V_1$ to $V_4$ are applied respectively to the lateral switches 115 to 118 which receive the signals $\phi_1$ to $\phi_4$ sequentially providing the level "1". Since all the output ends of the lateral switches 115 to 118 are connected in common, the resultant output voltage $V_{11}$ varies with time. The waveform of the voltage $V_{11}$ is shown in FIG. 4, having a graded shape. The voltage $V_{11}$ is applied to the non-inverted input of the comparator 114 to be compared with the inverted input, i.e. the changing voltage $V_{10}$ from the thermistor TH.

The output signal $V_{12}$ of the comparator 114 is applied to the latch circuits 110 to 113 as an input signal. On the other hand, the clock signals $CL_1$ to $CL_4$ supplied to the latch circuits have their waveforms as shown in FIGS. 2F to 2I. When the reference voltage signal $V_{11}$ is equal to the voltage $V_1$, the clock signal $CL_1$ takes the level "1" so that the output signal $V_{12}$ of the comparator 114 is delivered at the output $OUT_{11}$ of the latch circuit 110. Similarly, the output $V_{12}$ is delivered at the outputs $OUT_{12}$ to $OUT_{14}$ of the latch circuits 111 to 113 when the reference voltage signal $V_{11}$ is equal to the voltages $V_2$ to $V_4$, respectively.

The outputs $OUT_{11}$ to $OUT_{14}$ of the latch circuits 110 to 113 which are renewed every period $\tau$, are shown in Table I.

Table I

|  | $T < T_4$ $V_{10} > V_4$ | $T_4 < T < T_3$ $V_4 > T_{10} > V_3$ | $T_3 < T < T_2$ $V_3 > V_{10} > V_2$ | $T_2 < T < T_1$ $V_2 > V_{10} > V_1$ | $T_1 < T$ $V_1 > V_{10}$ |
|---|---|---|---|---|---|
| $OUT_{14}$ | 0 | 1 | 1 | 1 | 1 |
| $OUT_{13}$ | 0 | 0 | 1 | 1 | 1 |

Table I-continued

| | $T < T_4$ $V_{10} > V_4$ | $T_4 < T < T_3$ $V_4 > T_{10} > V_3$ | $T_3 < T < T_2$ $V_3 > V_{10} > V_2$ | $T_2 < T < T_1$ $V_2 > V_{10} > V_1$ | $T_1 < T$ $V_1 > V_{10}$ |
|---|---|---|---|---|---|
| $OUT_{12}$ | 0 | 0 | 0 | 1 | 1 |
| $OUT_{11}$ | 0 | 0 | 0 | 0 | 1 |

Accordingly, when the output $OUT_{11}$ to $OUT_{14}$ are connected through the current limitting resistors $R_{15}$ to $R_{18}$ with the light emitting diodes 11 to 14, the diodes are lit if the outputs $OUT_{11}$ to $OUT_{14}$ are at the level "1", but extinguished or not lit if they are at level "0". The higher the temperature, the larger is the number of the lit diodes. Thus, the temperature as an analog quantity is represented in a historgram or bar-graph form.

As described above, according to the first embodiment shown in FIG. 1, the display system can be constructed by using only one comparator. Therefore, it becomes easy to construct the display system in LSI circuit configuration, thus decreasing the production cost.

Figure 5:
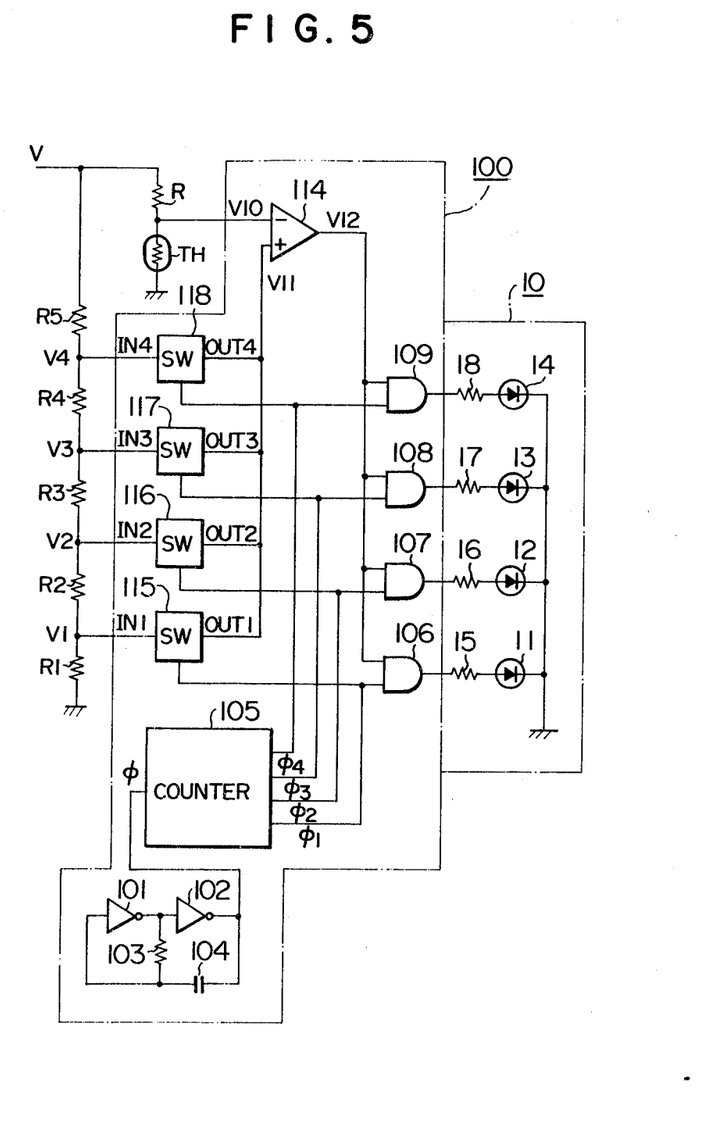
FIG. 5 shows a circuit diagram of a display system as a second embodiment of this invention.

FIG. 5 shows a circuit diagram of a display system as a second embodiment of this invention. This embodiment is different from the embodiment shown in FIG. 1 in that the latch circuits 110 to 113 are omitted. In FIG. 5, the components used in FIG. 1 are designated by the same reference numerals and symbols as in FIG. 1.

In FIG. 5, the connection to the AND circuits is somewhat altered in conjunction with the omission of the latch circuits. Namely, the output of the comparator 114 is connected with the input terminals of the AND circuits 106 to 109 (to which the oscillation signal $\phi$ was supplied in the embodiment of FIG. 1) and the output terminals of the AND circuits 106 to 109 are connected directly to the resistors 15 to 18 in the display section 10.

Though in the embodiment shown in FIG. 1 the operation of the display elements is of static drive mode wherein every element takes one of the two states of lighting and non-lighting, the embodiment in FIG. 5 employs a dynamic drive mode wherein the lighting of the elements is based on the scanning with a constant period. Namely, when the signal $\phi_1$ has the level "1", the reference voltage signal $V_{11}$ is equal to the voltage $V_1$, and if the output $V_{12}$ of the comparator 114 at that time is at the level "1", the light emitting diode 11 is lit. Then, when the signal $\phi_1$ resumes the level "0", the diode 11 is extinguished. In like manner, it follows that when the signals $\phi_2$ to $\phi_4$ have level "1" and only when the output $V_{12}$ of the comparator 114 is "1", the diodes 12 to 14 are lit at the duty cycle of $\frac{1}{4}$ of the period $\tau$. If the output $V_{12}$ of the comparator 114 is "0", the AND circuits 106 to 109 are not enabled so that none of the diodes 11 to 14 are lit.

Since the light emitting diodes are lit at the duty cycle of $\tau/4$, the time constant of the oscillation circuit determined by the resistor 103 and the capacitor 104 should be selected to be an appropriate value so as to prevent blinking. If this is done, the display in the display system of FIG. 5 quite resembles that in the display system of FIG. 1. Therefore, with the embodiment of FIG. 5 which needs no latch circuit, the system structure can be simplified and also a decrease in cost can be expected.

Figure 6:
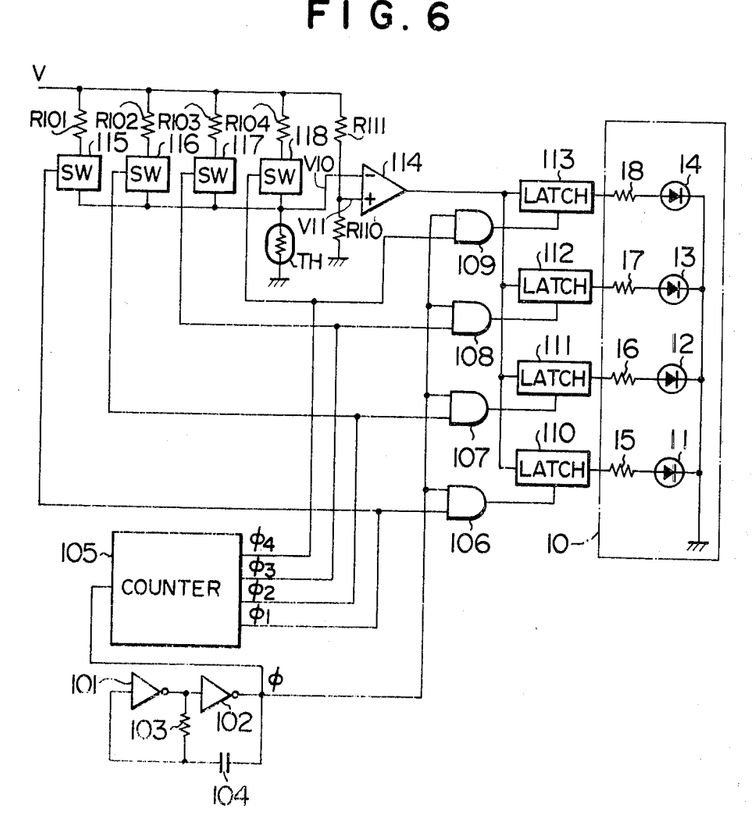
FIG. 6 shows a circuit diagram of a display system as a third embodiment of this invention.

FIG. 6 shows a circuit diagram of a display system as a third embodiment of this invention. This embodiment is different from the first embodiment in FIG. 1 in that the factors for changing the inputs to the comparator are concentrated on one of the input terminals. Also in FIG. 6, the components used in FIG. 1 are designated by the same reference numerals and symbols as in FIG. 1.

In FIG. 6, resistors 110 and 111 are series-connected with respect to the power source voltage V and the junction point of the resistors 110 and 111 is connected with the non-inverted input terminal of the comparator 114. Resistors 101 to 104 are connected in series with the lateral switches 115 to 118 and the output terminals of the lateral switches 115 to 118 are connected in common with the inverted input terminal of the comparator 114. The inverted input terminal of the comparator 114 is also grounded through the thermistor TH so that the voltage developed across the thermistor TH is used as an input signal for the inverted input terminal of the comparator 114.

Figure 7:
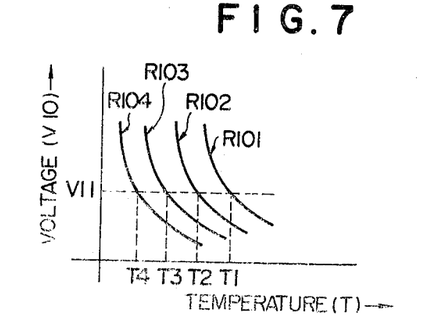
FIG. 7 is a graph for illustrating the operation of the embodiment shown in FIG. 6.

With such a circuit configuration, the input voltage $V_{10}$ can be changed as shown in FIG. 7. While the input signal $V_{11}$ is fixed to a constant value, the values of the resistors $R_{101}$ to $R_{104}$ are adjusted so that the temperatures $T_1$ to $T_4$ established for the respective characteristic curves are located apart from each other with a predetermined interval. In this manner, the display system shown in FIG. 6 can provide the same display as that shown in FIG. 1.

Figure 8:
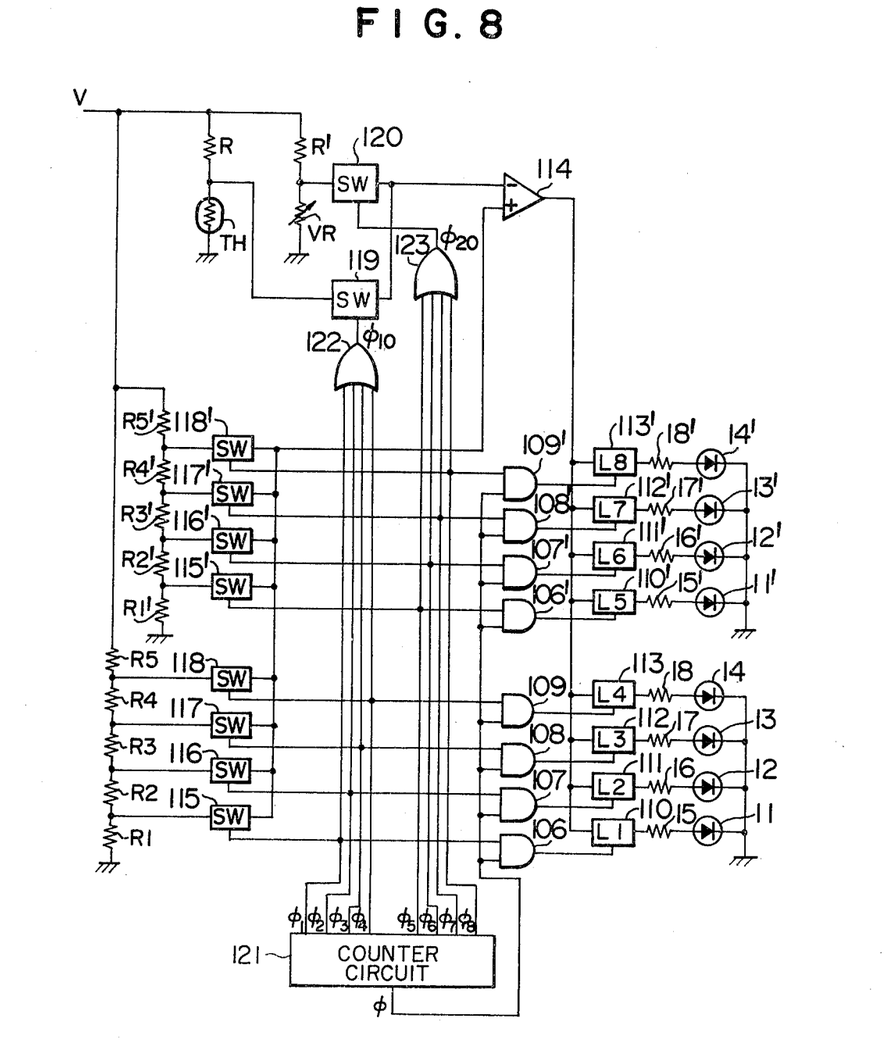
FIG. 8 shows a circuit diagram of a display system as a fourth embodiment of this invention.

FIG. 8 shows a circuit diagram of a display system as a fourth embodiment of this invention. In this embodiment, two kinds of inputs are selectively used in a change-over manner so that two types of information may be displayed by a single comparator. The system shown is intended for the display of water temperature and the quantity of fuel remaining in a vehicle.

The fourth embodiment is based in principle on the first embodiment shown in FIG. 1. The system includes a change-over circuit for two kind of inputs and can be obtained by duplicating the components of the system shown in FIG. 1, except the comparator. In FIG. 8, therefore, the components concerned with the display of water temperature are designated by the same reference numerals and symbols as in FIG. 1 while the components concerned with the display of the remaining fuel quantity and having the same functions as the components for the water temperature display are designated by the same but primed reference numerals and symbols.

As a sensor for detecting the remaining quantity of fuel is used a method in which a variable resistor VR is adjusted in an interlocking operation with the mechanical detection of the surface level of the liquid fuel. The variable resistor VR is connected in series with a resistor R' and the voltage at the junction point of the resistors VR and R' is applied to a lateral switch 120. The voltage from the thermistor TH is applied to a lateral switch 119. The outputs of the lateral switches 119 and 120 are connected in common with the inverted input terminal of the comparator 114. The lateral switches 119 and 120 are controlled by signals $\phi_1$ to $\phi_8$ delivered successively from a counter circuit 121. The lateral switch 119 is controlled by the signals $\phi_1$ to $\phi_4$ and the lateral switch 120 is controlled by the signals $\phi_5$ to $\phi_8$.

The signal $\phi_1$ to $\phi_4$ and $\phi_5$ to $\phi_8$ are respectively supplied to the lateral switches 119 and 120 through OR circuits 122 and 123.

Figure 9A:
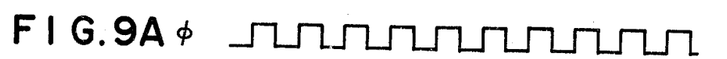
FIGS. 9A, 9B, 9C, 9D, 9E, 9F, 9G, 9H, 9I, 9J and 9K show waveforms appearing at various points in the system shown in FIG. 8.
Figure 9B:
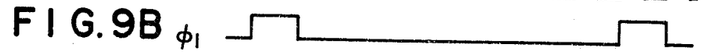
Figure 9C:
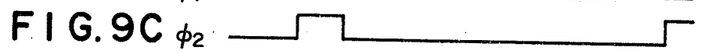
Figure 9D:
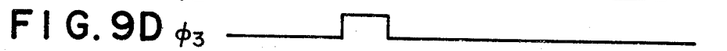
Figure 9E:
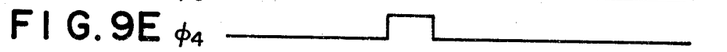
Figure 9F:
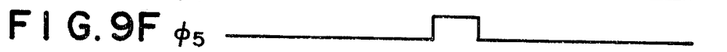
Figure 9G:
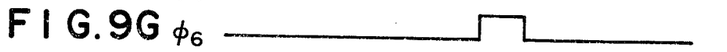
Figure 9H:
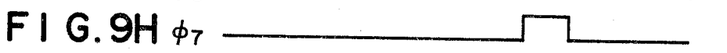
Figure 9I:
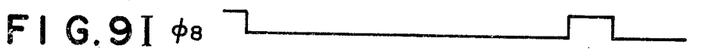
Figure 9J:
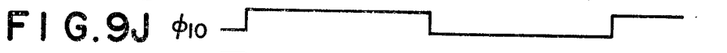
Figure 9K:
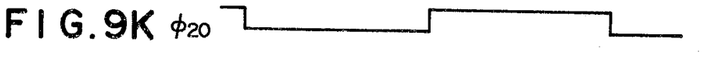

FIGS. 9A to 9K show waveforms of signals appearing at various points in the system in FIG. 8 when it is operated. FIG. 9A represents an oscillation output waveform $\phi$ from the counter circuit 121 which may be constructed by an oscillation circuit and a counter and resembles the oscillation circuit and the counter 15 in FIG. 1. FIGS. 9B to 9I represent the counter output waveforms $\phi_1$ to $\phi_8$ from the counter circuit 121. FIGS. 9J and 9K represent the output waveforms $\phi_{10}$ and $\phi_{20}$ from the OR circuits 122 and 123 which are alternately turned on and off.

In operation, the lateral switch 119 sends the water temperature related voltage across the thermistor TH to the comparator 114 in accordance with the output signal $\phi_{10}$ from the OR circuit 122 as shown in FIG. 9K. As a result, the light emitting diodes 11 to 14 are lit in accordance with the detected water temperature. Then, the output signal from the OR circuit 122 vanishes and the output signal $\phi_{20}$ from the OR circuit 123 as shown in FIG. 9J causes the lateral switch 120 to be conductive. In this stage, the lateral switch 119 is in the non-conductive state. As a result, the comparator 114 compares the fuel quantity related voltage across the variable resistor VR with the divided voltages (reference voltages) provided by the resistors $R_1'$ to $R_5'$ so that the display indicating the remaining quantity of fuel is effected by the light emitting elements 11' to 14'. Upon completion of the display of the remaining quantity of fuel, the counter circuit 121 stops delivering the signal $\phi_8$ and starts delivering the signal $\phi_1$ to resume the display of the water temperature.

According to the embodiment shown in FIG. 8, by merely employing additional lateral switches, counter, AND circuits and voltage setting circuit, and providing the OR gates, a voltage comparison can be made through the change-over of two input signals so that the output signals corresponding to the two types of input information can be obtained.

In the above description of the embodiments of this invention, only four light emitting diodes or display elements are used for one desired display, but the number of the display elements is by no means limited. An arbitrary number of display elements can be readily employed by changing the number of the outputs of the counter and correspondingly the numbers of the lateral switches, latch circuits and AND circuits. Instead of light emitting diodes, fluorescent display tubes, electroluminescent elements or liquid crystal elements may be employed as display elements with appropriate drive circuits.

Not only an analog signal but also any continuously changing signal can be used as an input signal. For example, a graded signal having a step like waveform may be used. Although in the described and shown embodiments only one of the two inputs to the comparator is allowed to change, it is possible to allow the two inputs to change as required.

As apparent from the foregoing, according to this invention, a continuously changing input signal is subjected to a voltage comparison in a voltage comparator circuit having only one comparator so that a plurality of display elements are lit up.

What is claimed is:

1. A display system wherein a plurality of display elements are driven by a voltage comparator circuit which produces output signals corresponding to a plurality of voltages preset for plural input signals when the voltage level of said input signals reaches the preset voltages respectively, said voltage comparator circuit comprising:
    switch means for alternately supplying said plural input signals for predetermined time intervals in its alternate change-over action;
    a comparator having one input terminal applied with said input signals alternately supplied from said switch means, the other output terminal applied with said present voltages, and an output terminal;
    counter means for generating a timing signal;
    control means for effecting the alternate change-over action of said switch means in accordance with said timing signal from said counter means and for successively applying said preset voltages to the other input terminal of said comparator in accordance with said timing signal from said counter means, so that said comparator successively produces said output signals corresponding to said preset voltages in synchronism with said timing signal;
    a plurality of gate means connected between the output terminal of said comparator and said display elements respectively; and
    means for selectively enabling said gate means in synchronism with said timing signal to energize the display element associated with the enabled gate means and corresponding to the preset voltage being applied to said comparator.

2. In a display system having a plurality of display elements which are driven by a voltage comparator circuit which produces output signals corresponding to a plurality of voltages preset for an input signal when the voltage level of said input signal reaches the preset voltages respectively, wherein said comparator circuit comprises one comparator having one input terminal applied with said input signal, the other input terminal applied with said preset voltages, and an output terminal and wherein a control means successively applies said preset voltages to the other input terminal of said comparator in accordance with a timing signal, so that said comparator successively produces said output signals corresponding to said preset voltages in synchronism with said timing signal, the improvement comprising a plurality of gate means connected between the output terminal of said comparator and said display elements respectively wherein said gate means include latch circuits which receive said output signals of said comparator and AND circuits which receive said timing signal and said output signals of said comparator respectively; and
    enabling means for selectively enabling said gate means in synchronism with said timing signal to energize the display element associated with the enabled gate means and corresponding to the preset voltage being applied to said comparator wherein said enabling means includes a counter which generates the timing signal to apply said timing signal to said AND circuits.

* * * * *